(12) United States Patent
Sethi (10) Patent No.: US 11,621,770 B2
(45) Date of Patent: Apr. 4, 2023

(54) METHOD OF HIGH SPEED AND DYNAMIC CONFIGURATION OF A TRANSCEIVER SYSTEM

(71) Applicant: Hughes Network Systems, LLC, Germantown, MD (US)

(72) Inventor: Yogesh Sethi, Boyds, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 560 days.

(21) Appl. No.: 16/730,254

(22) Filed: Dec. 30, 2019

(65) Prior Publication Data

US 2021/0199718 A1 Jul. 1, 2021

(51) Int. Cl.
| | |
|---|---|
| H04B 7/185 | (2006.01) |
| G01R 31/317 | (2006.01) |
| G01R 31/3185 | (2006.01) |
| G01R 31/30 | (2006.01) |
| G01R 31/319 | (2006.01) |

(52) U.S. Cl.
CPC ..... *H04B 7/18517* (2013.01); *G01R 31/3008* (2013.01); *G01R 31/31715* (2013.01); *G01R 31/31905* (2013.01); *G01R 31/318502* (2013.01)

(58) Field of Classification Search
None
See application file for complete search history.

(56) References Cited

U.S. PATENT DOCUMENTS

| | | | | |
|---|---|---|---|---|
| 2014/0281119 A1* | 9/2014 | Hyun | ............... | G06F 12/0646 |
| | | | | 711/102 |
| 2019/0079885 A1* | 3/2019 | Staudenmaier | ......... | G06F 17/16 |
| 2019/0171604 A1* | 6/2019 | Brewer | ............... | G06F 13/4022 |

* cited by examiner

*Primary Examiner* — Shripal K Khajuria
(74) *Attorney, Agent, or Firm* — Global IP Counselors, LLP (57) ABSTRACT

A field-programmable gate array includes a memory, a firmware state machine, a register, and an interconnect structure. The memory is configured to store a plurality of configurations. Each of the plurality of configurations has at least one parameter associated therewith. The firmware state machine is configured to read the parameters stored in the memory. The register is configured to have the parameters associated with the plurality of configurations written thereto. The interconnect structure is configured to transmit the parameters between the firmware state machine and the register. The interconnect structure is configured to receive the parameters associated with the plurality of the configurations simultaneously and the interconnect structure is configured to transmit the received parameters associated with the plurality of configurations to the register simultaneously.

20 Claims, 4 Drawing Sheets

METHOD OF HIGH SPEED AND DYNAMIC CONFIGURATION OF A TRANSCEIVER SYSTEM

BACKGROUND

Field of the Invention

This invention generally relates to a method of high speed and dynamic configuration of a transceiver system. This invention also generally relates to a transceiver system having a processor and a plurality of field-programmable gate arrays configured to be configured in parallel.

Background Information

Modern satellite communication systems are complex. Dynamically changing the configuration of these satellite communication systems takes valuable time, which can cause disruption of traffic data. Configuration and reconfiguration to control various aspects of a satellite communication system involve changes to key parameters in a transmitter and a receiver, or in a transceiver. Typically, these configurations and reconfigurations are done by software over either a high-speed bus or a slow serial interface. The configurations and reconfigurations are done serially by software and are extremely slow and fail to achieve modern day performance specifications of system availability. Accordingly, a need exists for a satellite communication system in which a field-programmable gate array is configured more quickly.

SUMMARY

An object of the disclosure is to provide a method of high speed and dynamic configuration of a transceiver system.

In accordance with one aspect of the present disclosure, a field-programmable gate array includes a memory, a firmware state machine, a register, and an interconnect structure. The memory is configured to store a plurality of configurations. Each of the plurality of configurations has at least one parameter associated therewith. The firmware state machine is configured to read the parameters stored in the memory. The register is configured to have the parameters associated with the plurality of configurations written thereto. The interconnect structure is configured to transmit the parameters between the firmware state machine and the register. The interconnect structure is configured to receive the parameters associated with the plurality of the configurations simultaneously and the interconnect structure is configured to transmit the received parameters associated with the plurality of configurations to the register simultaneously.

Another aspect of the present invention includes a method of configuring a field-programmable gate array. A first parameter associated with a first configuration stored in a memory of the field-programmable gate array is read. A second parameter associated with a second configuration stored in the memory of the field-programmable gate array is read. The second parameter is read simultaneously with the first parameter. The first parameter associated with the first configuration is written to a first register space of a register. The second parameter associated with the second configuration is written to a second register space of the register. The second parameter is written simultaneously with the first parameter.

Also other objects, features, aspects and advantages of the disclosed system and method of configuring a field-programmable gate array will become apparent to those skilled in the art from the following detailed description, which, taken in conjunction with the annexed drawings, discloses exemplary embodiments of the system and method of configuring a field-programmable gate array.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
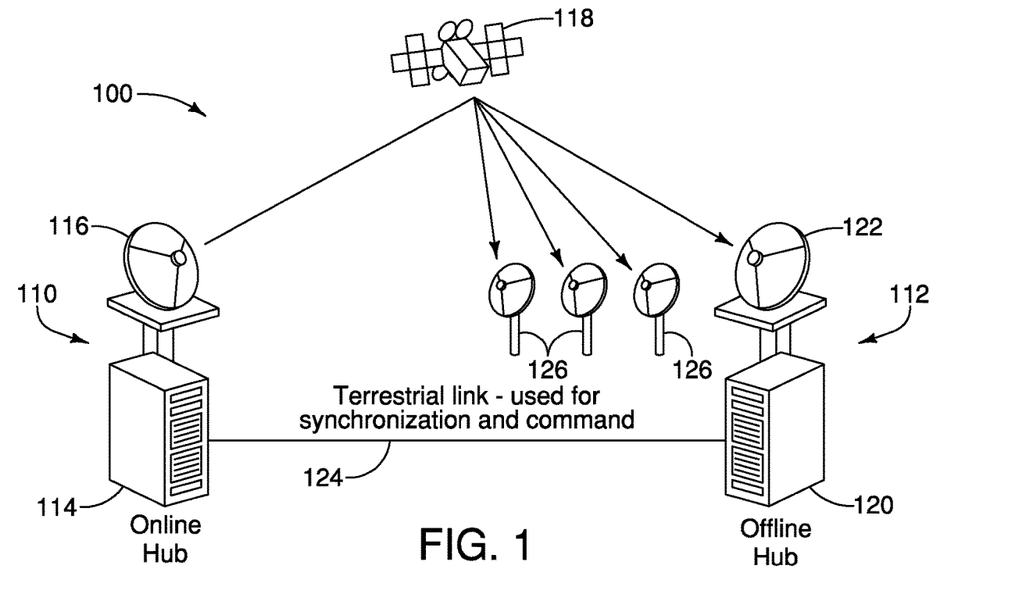
FIG. 1 is a diagram of a satellite communication system in accordance with an exemplary embodiment of the present invention configured to operate in a redundancy mode.
Figure 2:
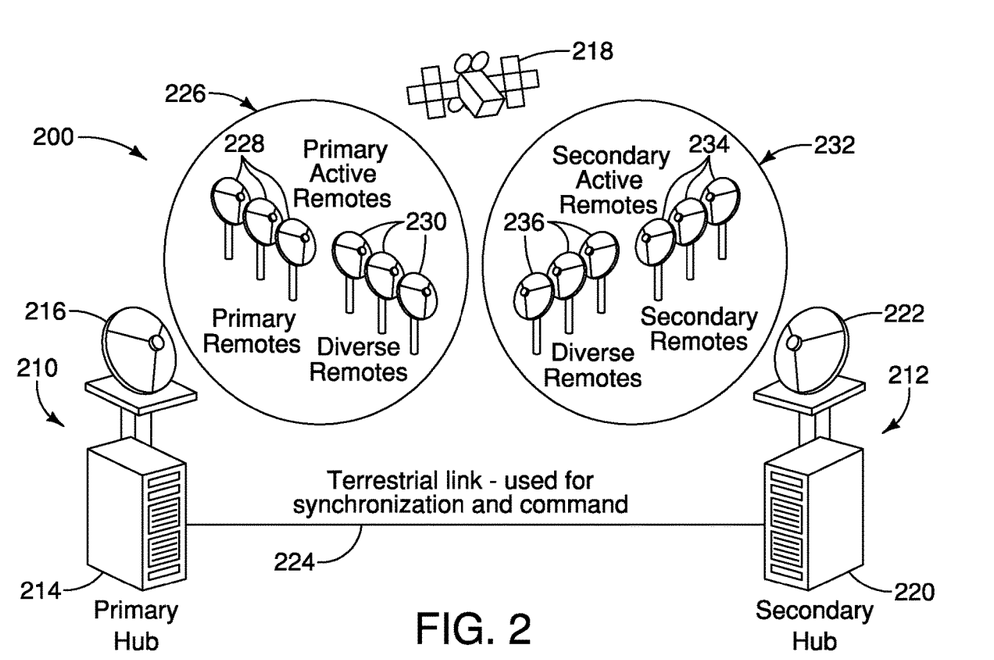
FIG. 2 is a diagram of a satellite communication system in accordance with an exemplary embodiment of the present invention configured to operate in a diversity mode.

Referring initially to FIGS. 1 and 2, a satellite communication system in accordance with exemplary embodiments of the present invention is illustrated. In FIG. 1, the satellite communication system 100 is configured to operate in a redundancy mode. In FIG. 2, the satellite communication system 200 is configured to operate in a diversity mode. A redundant hub is geographically separate from a primary hub. The redundant hub facilitates maintaining continuous operation when the primary hub fails to operate in a normal condition, such as due to rain fade or other failure.

The satellite communication system 100 operating in a redundancy mode includes a primary hub 110 and a redundant hub 112, as shown in FIG. 1. The primary hub 110 includes a transceiver 114 in communication with a satellite terminal 116, which is configured to communicate with a satellite 118. The redundant hub 112 includes a transceiver 120 in communication with a satellite terminal 122, which is configured to communicate with the satellite 118.

The primary hub 110 and the secondary hub 112 are geographically separated. The transceiver 114 of the primary hub 110 and the transceiver 120 of the redundant hub 112 are connected by a terrestrial link 124 that is used for synchronization and command therebetween. The terrestrial link 124 can be used to transmit the command to bring the offline hub online. The terrestrial link 124 also connects the databases of the primary and redundant hubs 110 and 112 such that changes made to the online hub are synchronized with the offline hub.

The satellite communication system 100 operates in redundancy mode such that at any point in time one of the primary hub 110 and the redundant hub 112 is online and the other of the primary hub 110 and the redundant hub 112 is offline. When a failure occurs at the online hub, the offline hub is brought online to facilitate operation of the satellite communication system 100 without interruption. The primary hub 110 and the redundant hub 112 are preferably identically configured such that the satellite communication system 100 remains fully operational with no sacrifice in traffic quality between the primary hub 110 and the redundant hub 112.

When a redundancy switchover is activated, the online hub goes offline. As shown in FIG. 1, the primary hub 110 is initially online. In the event of a failure, the primary hub 110 would go offline. Remote terminals 126 lose the outbound channel. The offline hub goes online. The redundant hub 112 is initially offline, and goes online upon receiving the activation signal over the terrestrial link 124. The remote terminals 126 then acquire the outbound channel, and the transmission control protocol (TCP) sessions are restored.

The satellite communication system 200 operating in a diversity mode includes a primary hub 210 and a secondary hub 212, as shown in FIG. 2. The primary hub 210 includes a transceiver 214 in communication with a satellite terminal 216, which is configured to communicate with a satellite 218. The secondary hub 212 includes a transceiver 220 in communication with a satellite terminal 222, which is configured to communicate with the satellite 218.

The transceiver 214 of the primary hub 210 and the transceiver 220 of the redundant hub are geographically separated from one another. The transceiver 214 of the primary hub 210 and the transceiver 220 of the secondary hub 212 are connected by a terrestrial link 224 that is used for synchronization and command therebetween. The terrestrial link 224 connects the databases of the primary and secondary hubs 210 and 212 such that changes made to the primary hub 210 are synchronized with the secondary hub 212.

A first plurality of remote terminals 226 are associated with the primary hub 210. The first plurality of remote terminals 226 includes a plurality of remote terminals 228 assigned exclusively to the primary hub 210. In other words, the plurality of remote terminals 228 are not configured to switch to the secondary hub 212. The first plurality of remote terminals 226 also includes a plurality of diverse remote terminals 230 that can be assigned to either the primary hub 210 or to the secondary hub 212.

A second plurality of remote terminals 232 are associated with the secondary hub 212. The second plurality of remote terminals 232 includes a plurality of remote terminals 234 assigned exclusively to the secondary hub 212. In other words, the plurality of remote terminals 234 are not configured to switch to the primary hub 210. The second plurality of remote terminals 232 also includes a plurality of diverse remote terminals 236 that can be assigned to either the primary hub 210 or to the secondary hub 212.

The diversity mode configuration of the satellite communication system 200 allows the primary and second hubs 210 and 212 to be simultaneously active. The plurality of remote terminals 228 and 234 are configured to be associated exclusively with the primary hub 210 or the secondary hub 212, respectively. The plurality of diverse remote terminals 230 and 236 are configured to be associated with the primary hub 210 or the secondary hub 212, respectively, and are further configured to switch from the one hub to the other hub when a failure occurs at the one hub. For example, the diverse remote terminals 230 are associated with the primary hub 210. When a failure occurs at the primary hub 210, the plurality of diverse remote terminals 230 are configured to switch to the secondary hub 212. The plurality of diverse terminals 236 are similarly configured. The terrestrial link 224 can be used to transmit the command to switch the plurality of diverse remote terminals 230 and 236 from one of the primary and second hubs to the other of the primary and secondary hubs.

The transceivers illustrated in FIGS. 1 and 2 include a transmitter and a receiver. The transmitter transmits data over a wireless communication channel between the satellite terminal and the satellite. Similarly, the receiver receives data over a wireless communication channel between the satellite terminal and the satellite. The transceiver can include additional components, such as a channel adjuster to adjust channel parameters of the satellite transmitter.

Satellite communication systems usually require either redundancy (FIG. 1) or diversity switching (FIG. 2) at the gateway, or hub, level, which is usually referred to as N+K with K redundant backup, or diverse, gateways, for N primary gateways. As shown in FIG. 1, for example, the satellite communication system 100 has one primary gateway 110 and one redundant backup gateway 112. To achieve high availability, the switching time between these systems needs to be minimized. The method and system in accordance with exemplary embodiments of the present invention achieves this by keeping configuration parameters of the primary gateway 110 stored locally in the hardware (FPGAs) of the redundant (diverse) gateway 112. Once a switching command is received, such as through the terrestrial link 124, the firmware in the FPGA configures the FPGA in a fraction of the time compared to software-controlled downloading of configuration parameters in the conventional method.

The method and system in accordance with exemplary embodiments of the present invention bypasses slow software control of the conventional method and instead uses firmware to achieve faster and dynamic configuration, including reconfiguration. This method and system allow for access to the FPGA configuration space by the local state machine when fast configuration speed is necessary and allow for simultaneous access to the software for complex manipulations.

Figure 3:
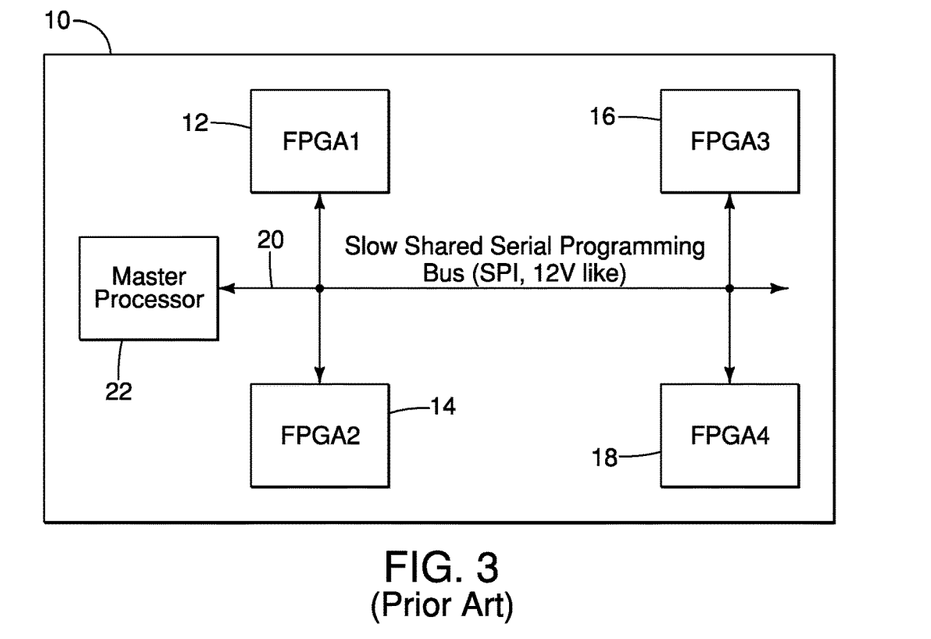
FIG. 3 is a schematic diagram of a conventional multi-chip system.

Conventional field-programmable gate array (FPGA) boards 10, as shown in FIG. 3, used in transceivers include multiple FPGAs 12, 14, 16 and 18 mounted on the board 10. The plurality of FPGAs conventionally requires a significant total configuration time. Additionally, because software is involved in the configuration of each parameter, the configuration times are even slower, especially, when not running on a real-time embedded system. On average, there are thousands of reads and writes required to configure an FPGA 12, which can increase the total configuration time from tens of milliseconds to a few seconds, depending on the particular system.

Figure 4:
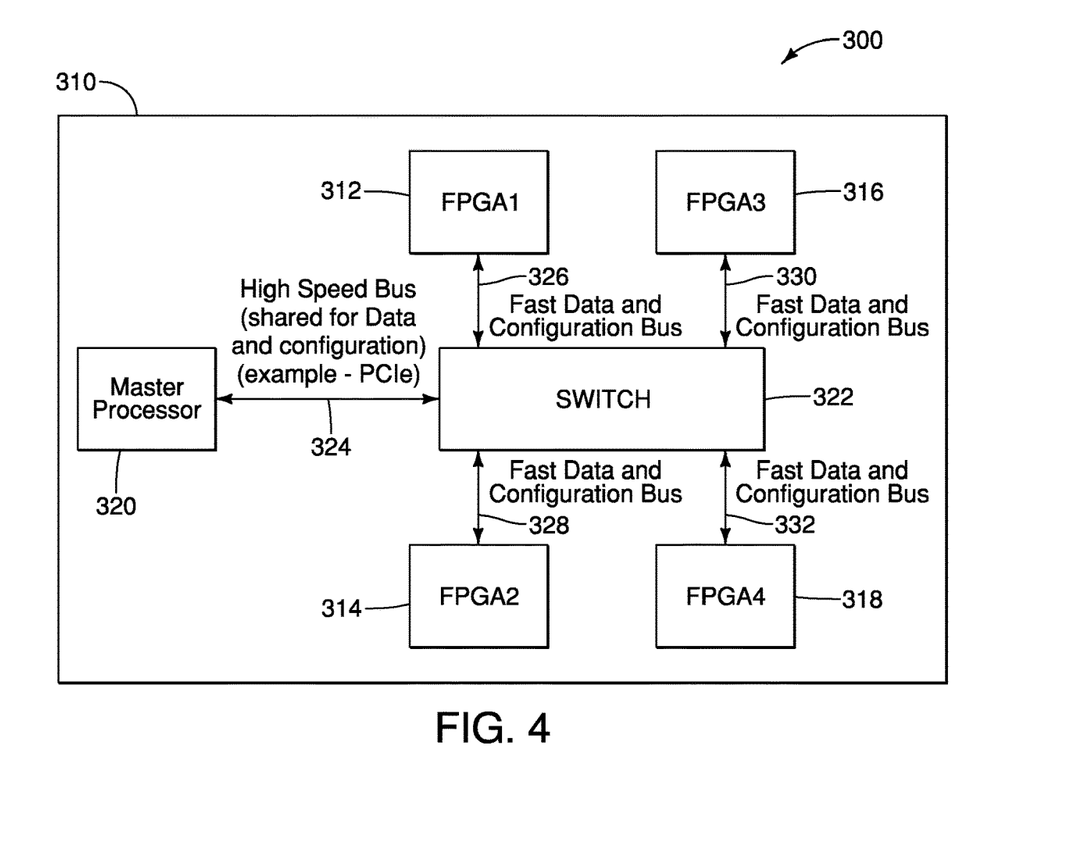
FIG. 4 is a schematic diagram of a transceiver system in accordance with an exemplary embodiment of the present invention.

FIGS. 3 and 4 illustrate how a transceiver system is typically connected for programming in a conventional system (FIG. 3) and in accordance with a method and system in accordance with exemplary embodiments of the present invention (FIG. 4). FIG. 3 illustrates a shared serial interface used for configuring the system. FIG. 4 illustrates a point-to-point fast shared data and configuration bus used for configuring the transceiver system.

Figure 7:
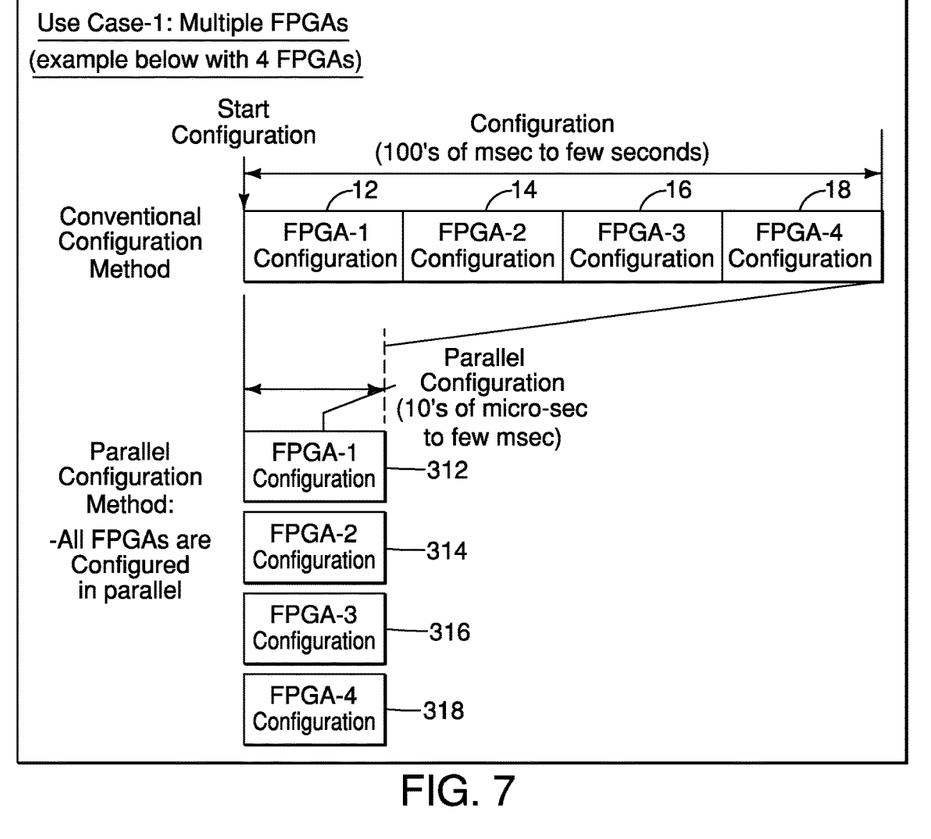
FIG. 7 is a schematic diagram of a multiple field-programmable gate array system configured in accordance with an exemplary embodiment of the present invention.

As shown in FIG. 3, a conventional board 10 has a plurality of FPGAs 12, 14, 16 and 18, which are programmed serially, as they either share a bus 20 or a single software thread. The board 10 has four FPGAs 12, 14, 16 and 18 mounted thereon, that are connected to a master processor 22 by a shared bus 20. When configuration is required, the master processor sends a configuration signal on the bus 20 to the first FPGA 12, which is then configured. The configuration signal is then transmitted on the bus 20 to the second FPGA 14, which is then configured. The configuration signal is then transmitted on the bus 20 to the third FPGA 16, which is then configured. The configuration signal is then transmitted on the bus 20 to the fourth FPGA 18, which is then configured. This process continues until all the FPGAs on the board 10 are configured. As shown in FIG. 7, the configuration time is significant as each of the FPGAs is serially configured, such that the configuration time of each FPGA is added together for the total configuration time.

The FPGA configuration method and system in accordance with exemplary embodiments of the present invention provides advantages for a communication system. First, the method and system provide fast and reliable configuration and reconfiguration to minimize downtime of a system. Second, the method and system provide deterministic configuration time, because the system knows exactly when new the configuration or reconfiguration will be effective in time. The method and system in accordance with exemplary embodiments of the present invention allow for simultaneous configuration by both the firmware and software of the FPGA. A firmware state machine within FPGA can configure the majority of the parameters fast and software can process parallel paths for access to configuration space as well.

As shown in FIG. 4, a board 310 of a transceiver system 300 in accordance with exemplary embodiments of the present invention includes a plurality of FPGAs 312, 314, 316 and 318, which are programmed in parallel, because the plurality of FPGAs 312, 314, 316 and 318 do not share a common bus or single software thread. The board 310 of the transceiver system 300 has four FPGAs 312, 314, 316 and 318 mounted thereon, that are connected to a master processor 320. Preferably, the four FPGAs 312, 314, 316 and 318 are connected to the master processor 320 by a peripheral component interconnect express, which includes a switch 322 and a high speed bus 324. Each of the FPGAs 312, 314, 316 and 318 is connected to the switch 322 by a plurality of different buses 326, 328, 330 and 332. Each of the buses 326, 328, 330 and 332 is preferably a fast data and configuration bus. The switch 322 is connected to the master processor 320 by the high speed bus 324. The bus 324 is shared for data and configuration. When configuration is required, the master processor 320 sends a configuration signal on each of the buses 326, 328, 330 and 332 to the respective first FPGA 312, the second FPGA 314, the third FPGA 316 and the fourth FPGA 318, are then configured in parallel. As shown in FIG. 7, the configuration time when the plurality of FPGAs are configured in parallel is significantly less than when the plurality of FPGAs are configured serially. The plurality of FPGAs are configured in parallel, such that the total configuration time is substantially the configuration time required to configure one FPGA. The method and system in accordance with exemplary embodiments of the present invention provide for quicker and more efficient configuration of the parameters of an FPGA without disrupting traffic data over the satellite communication system. As shown in FIG. 7, the configuration time of each FPGA with the parallel configuration method, and thus the total configuration time, is less than the configuration time of one FPGA, i.e., FPGA-1, with the conventional serial configuration method. Although the board 310 of the transceiver system 300 is shown with four FPGAs, any suitable number of FPGAs can be mounted on the board. The processor 320 is shown mounted on the board 310, although the processor can be disposed remote from the board, such as on a server.

Figure 5:
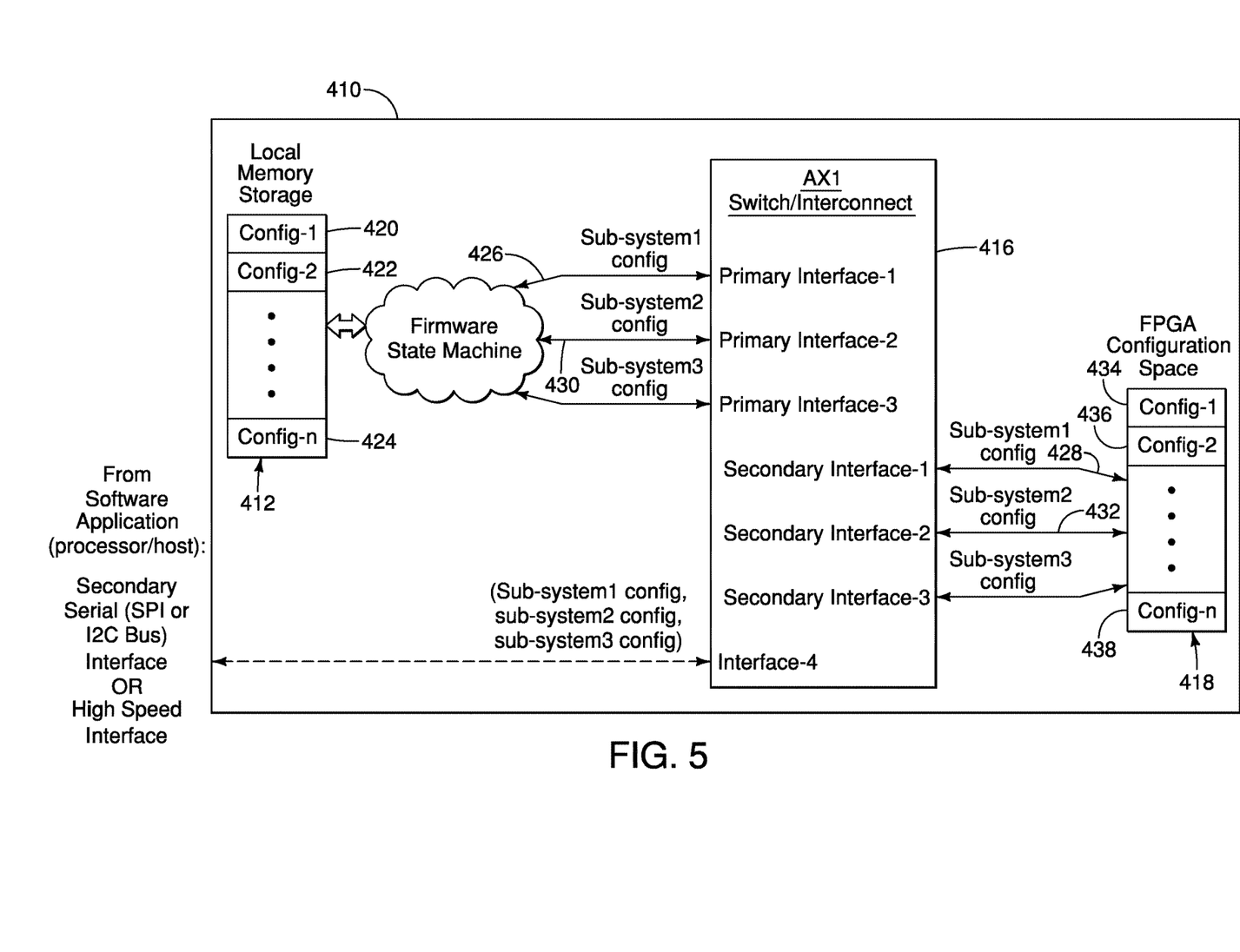
FIG. 5 is a schematic diagram of a field-programmable gate array in accordance with an exemplary embodiment of the present invention.

As shown in FIG. 5, an FPGA 410 in accordance with exemplary embodiments of the present invention include a local memory 412, a firmware state machine 414, an interconnect structure 416, and an FPGA configuration space 418.

A plurality of configurations are stored locally within the FPGA memory 412 and are available to the FPGA when a command for configuration, such as a reconfiguration or switching, is transmitted. Each configuration is separately stored in the FPGA memory 412, such that each configuration is separately available. As shown in FIG. 5, a first configuration 420, a second configuration 422 and through an nth configuration 424 are stored in the FPGA memory 412. Each of the configurations has at least one parameter associated therewith.

Figure 6:
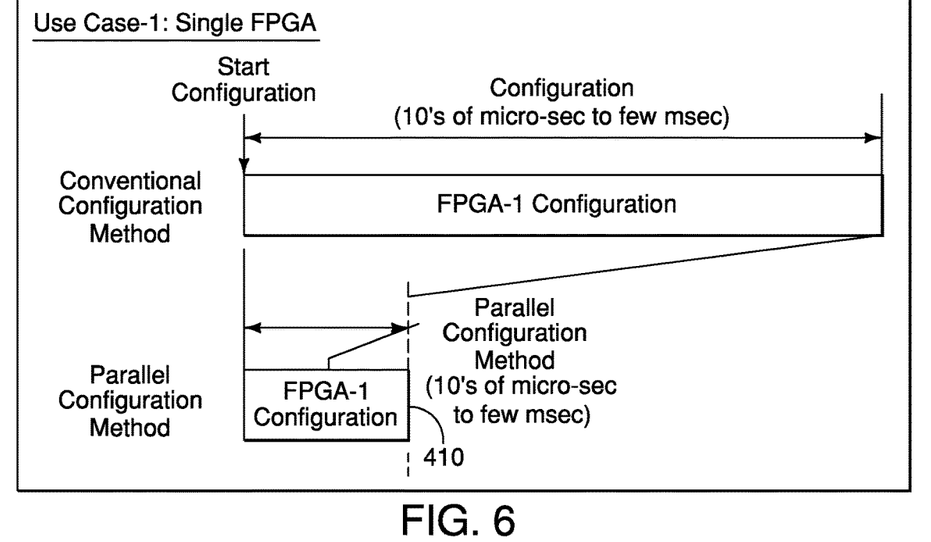
FIG. 6 is a schematic diagram of a single field-programmable gate array system configured in accordance with an exemplary embodiment of the present invention.

The firmware state machine 414 within the FPGA firmware reads the necessary parameters associated with the requested configuration from the FPGA memory 412 and writes to the appropriate configuration space 418 within the FPGA 418. For example, the firmware state machine 414 reads the parameters associated with the first configuration 420 from the FPGA memory 412, and writes to the appropriate configuration space 418 within the FPGA 418. Parameters associated with the second configuration 422 are read by the firmware state machine 414 and written to the appropriate configuration space 422 within the FPGA 410 in parallel with the parameters of the first configuration as shown in FIG. 5. By reading and writing the configurations in parallel, this method in accordance with the exemplary embodiments of the present invention allows for configuration in a fraction of the time compared to a conventional configuration time as shown in FIG. 6.

The interconnect structure 416, such as an AXI Switch/Interconnect, provides simultaneous access by multiple primary to distinct secondary interfaces. As shown in FIG. 5, a first primary interface 426 transmits the parameters associated with the first configuration 420 through the interconnect structure 416 to the first secondary interface 428 to be written in the appropriate configuration space 418. A second primary interface 430 transmits the parameters associated with the second configuration 422 through the interconnect structure 416 to the second secondary interface 432 to be written in the appropriate configuration space 418. The interconnect structure 416 provides simultaneous access such that the parameters associated with each of the separate configurations stored in the FPGA memory 412 can be accessed and written to the configuration space 418 in parallel to reduce the configuration time for the FPGA 410 as shown in FIG. 6.

The FPGA configuration space 418 is the register space where the configuration is applied through register reads and writes. As shown in FIG. 6, the configuration space 418 is divided into multiple sub-system configuration, or register, spaces that can be read and written to in parallel. For example, the configuration space is divided into a number of sub-system configuration, or register, spaces equal to the number of configurations stored in the memory 412. In other words, each sub-system configuration space is associated with the respective configuration space in the memory 412. The first sub-system configuration space 434 is associated with the first configuration 420 stored in the memory 412. The second sub-system configuration space 436 is associated with the second configuration 422 stored in the memory 412. The nth sub-system configuration space 438 is associated with the nth configuration 424 stored in the memory 412.

The interconnect structure 416 is designed in such a manner that allows for simultaneous access to different elements within the FPGA 410, as shown in FIG. 5. Conventionally, the software from a host accesses only a single bus (e.g., primary interface-4), as shown by the dashed line in FIG. 5, such that the programming of the FPGA is done sequentially. The method and system in accordance with exemplary embodiments of the present invention provides the firmware state machine 414, which is inherently fast and runs at system clock, to take advantage of parallelism built into the FPGA configuration space 418 and to configure the sub-systems in parallel at a fraction of the time.

FIGS. 6 and 7 illustrate the difference in the configuration times for the conventional configuration system and for the method and configuration system in accordance with exemplary embodiments of the present invention for a single FPGA system (FIG. 6) and for a multiple FPGA system (FIG. 7).

As shown in FIG. 6, for a single FPGA system, the conventional method uses a serial configuration method, as described above, which results in a total configuration time from tens of micro-seconds to a few milliseconds. With a method and system of parallel configuration in accordance with exemplary embodiments of the present invention, the total configuration time is substantially reduced.

As shown in FIG. 7, for a multiple FPGA system, the conventional method uses a serial configuration method, as described above, which results in a total configuration time from hundreds of milliseconds to a few seconds. With a method and system of parallel configuration in accordance with exemplary embodiments of the present invention, the total configuration time is substantially reduced, resulting in a total configuration time of tens of micro-seconds to a few milliseconds.

The method and system in accordance with exemplary embodiments of the present invention can be applied in any suitable manner. For example, the method and system of exemplary embodiments of the present invention can be used in the satellite system with diversity switching (FIG. 2). The method and system of exemplary embodiments of the present invention can also be used in satellite systems with beam hopping and any system that requires quick and deterministic configuration.

The method and system in accordance with exemplary embodiments of the present invention can be used in the diversity switching application. For satellite systems deployed with diversity switching, the reconfiguration requires minimal disruption (approximately tens of milliseconds) of traffic data. This configuration time cannot be met with the conventional serial mode of configuration and requires a faster method of configuration.

The diverse gateway stores the configurations of all the RF gateways it serves within the FPGA and when the command is given to switch for a given site, only the command for the site location need to be given and all the appropriate configuration will be loaded by the FPGA logic.

The method and system of exemplary embodiments in accordance with the present invention can also be used in a satellite beam hopping system in which switching between different beams requires precise control of reconfiguration of beam parameters, like symbol rate, frequency, and so forth. This method and system provides configuration, including reconfiguration, of a beam hopping system not only fast but also deterministic. This method and system allow for precise control of when new the configuration parameter takes effect in time, because the configuration is done in parallel the total configuration time is known, which in turn allows for little to no-padding in the waveform format thus improving efficiency. This method and system effectively controls the exact time of switching to tens of nano-seconds or quicker.

The method and system in accordance with exemplary embodiments of the present invention can also be used to quickly configure, including reconfigure, transceiver parameters. With the advent of a channelized payload on a satellite, the transmitter of a transceiver is required to change the number of carriers, bandwidth and frequency of each carrier. The method and system of exemplary embodiments of the present invention minimizes the downtime between these configurations, including reconfigurations.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a vehicle equipped with the method and system of exemplary embodiments of the present invention. Accordingly, these terms, as utilized to describe the present invention should be interpreted relative to a vehicle equipped with the method and system of exemplary embodiments of the present invention.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A field-programmable gate array comprising:
a memory configured to store a plurality of configurations including at least a first configuration and a second configuration, each of the plurality of configurations having at least one parameter associated therewith;
a firmware state machine configured to read the parameters stored in the memory;
a register configured to have the parameters associated with the plurality of configurations written thereto; and
an interconnect structure configured to transmit the parameters between the firmware state machine and the register, the interconnect structure being configured to receive the parameters associated with the first configuration and the second configuration simultaneously and the interconnect structure being configured to transmit the received parameters associated with the first configuration and the second configuration to the register simultaneously.

2. The field-programmable gate array according to claim 1, wherein
the memory has a number of memory spaces corresponding to a number of the plurality of configurations.

3. The field-programmable gate array according to claim 2, wherein
the register has a number of register spaces corresponding to the number of the plurality of configurations.

4. The field-programmable gate array according to claim 3, wherein
the interconnect structure has a plurality of primary interfaces, each of the plurality of primary interfaces being connected to a different one of the plurality of configurations stored in the memory.

5. The field-programmable gate array according to claim 4, wherein
the interconnect structure has a plurality of secondary interfaces, each of the plurality of secondary interfaces being connected to a different one of the plurality of primary interfaces.

6. The field-programmable gate array according to claim 5, wherein
each of the plurality of register spaces is connected to a different one of the plurality of secondary interfaces.

7. The field-programmable gate array according to claim 1, wherein
a total configuration time of the field-programmable gate array is an amount of time to read one of the plurality of configurations from the memory and write the one of the plurality of configurations to the register.

8. A transceiver system for a satellite communication system, comprising:
a circuit board;
a processor mounted on the circuit board; and
the field-programmable gate array of claim 1 mounted on the circuit board and connected to the processor.

9. A transceiver system for a satellite communication system, comprising:
a circuit board;
a processor mounted on the circuit board; and
a plurality of the field-programmable gate arrays of claim 1 mounted on the circuit board and connected to the processor.

10. The transceiver system according to claim 9, wherein
each of the plurality of the field-programmable gate arrays is connected to the processor by a different bus.

11. The transceiver system according to claim 10, wherein
a total configuration time of the board is an amount of time to configure one of the plurality of field-programmable gate arrays.

12. The transceiver system according to claim 10, wherein
the plurality of field-programmable gate arrays are configured to be configured in parallel.

13. The transceiver system according to claim 9, wherein
each of the plurality of field programmable gate arrays is connected to a switch, the switch being connected to the processor.

14. A method of configuring a field-programmable gate array, comprising the steps of
reading a first parameter associated with a first configuration stored in a memory of the field-programmable gate array;
reading a second parameter associated with a second configuration stored in the memory of the field-programmable gate array, the second parameter being read simultaneously with the first parameter;
writing the first parameter associated with the first configuration to a first register space of a register; and
writing the second parameter associated with the second configuration to a second register space of the register, the second parameter being written simultaneously with the first parameter.

15. The method of configuring a field-programmable gate array according to claim 14, wherein
the total configuration time for configuring a plurality of parameters of the field-programmable gate array is an amount of time to read and write one of the plurality of parameters to one register space of the register.

16. A method of configuring a field-programmable gate array board, the board having a plurality of field-programmable gate arrays configured in accordance with claim 14, the method comprising the steps of
configuring each of the plurality of field-programmable gate arrays in parallel.

17. The method of configuring a field-programmable gate array board according to claim 16, wherein
a total configuration time to configure the plurality of field-programmable gate arrays is an amount of time to configure one of the field-programmable gate arrays.

18. The method of configuring a field-programmable gate array board according to claim 17, wherein
each of the plurality of field-programmable gate arrays is connected to a processor by a different bus.

19. The field-programmable gate array according to claim 1, wherein
the memory includes a first configuration space configured to store the first configuration and a second configuration space configured to store the second configuration, and
the interconnect structure is configured to simultaneously receive at least one parameter associated with the first configuration from the first configuration space and least one parameter associated with the second configuration from the second configuration space.

20. The field-programmable gate array according to claim 1, wherein
the register includes a first configuration space configured to have parameters of the first configuration written thereto and a second configuration space configured to have parameters of the second configuration written thereto, and the interconnect structure is configured to simultaneously transmit at least one parameter associated with the first configuration to the first configuration space and at least one parameter associated with the second configuration to the second configuration space.

\* \* \* \* \*